(12) United States Patent
Park

(10) Patent No.: US 8,238,163 B2
(45) Date of Patent: Aug. 7, 2012

(54) NONVOLATILE MEMORY DEVICE

(75) Inventor: Seong Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 282 days.

(21) Appl. No.: 12/647,571

(22) Filed: Dec. 28, 2009

(65) Prior Publication Data
US 2010/0195394 A1 Aug. 5, 2010

(30) Foreign Application Priority Data
Feb. 4, 2009 (KR) .................. 10-2009-0008802

(51) Int. Cl.
*G11C 16/06* (2006.01)
(52) U.S. Cl. .......... 365/185.22; 365/185.24; 365/189.05
(58) Field of Classification Search ............. 365/185.03, 365/185.08, 185.12, 185.17, 189.05, 185.24
See application file for complete search history.

(56) References Cited

U.S. PATENT DOCUMENTS

| | | | |
|---|---|---|---|
| 7,336,538 B2 * | 2/2008 | Crippa et al. | 365/185.12 |
| 7,391,651 B2 * | 6/2008 | Chen | 365/185.24 |
| 7,508,732 B2 * | 3/2009 | Park et al. | 365/235 |
| 7,515,472 B2 * | 4/2009 | Chung | 365/185.21 |
| 7,630,238 B2 * | 12/2009 | Crippa et al. | 365/185.03 |
| 2008/0123411 A1 * | 5/2008 | Crippa et al. | 365/185.03 |

FOREIGN PATENT DOCUMENTS
KR  1020080029749  4/2008

OTHER PUBLICATIONS

Notice of Preliminary Rejection issued from Korean Intellectual Property Office on Feb. 24, 2011.

* cited by examiner

*Primary Examiner* — Gene Auduong
(74) *Attorney, Agent, or Firm* — IP & T Group LLP

(57) ABSTRACT

A page buffer of a nonvolatile memory device according to the present disclosure comprises a first data latch unit configured to store data for program or program inhibition, a second data latch unit configured to store data for setting threshold voltage states of cells to be programmed, and a 1-bit pass determination unit configured to determine whether a cell to be programmed has been programmed to exceed a verification voltage by grounding or making floating a first verification signal output terminal in response to data set to a first node of the first data latch unit and data applied to a sense node.

21 Claims, 3 Drawing Sheets

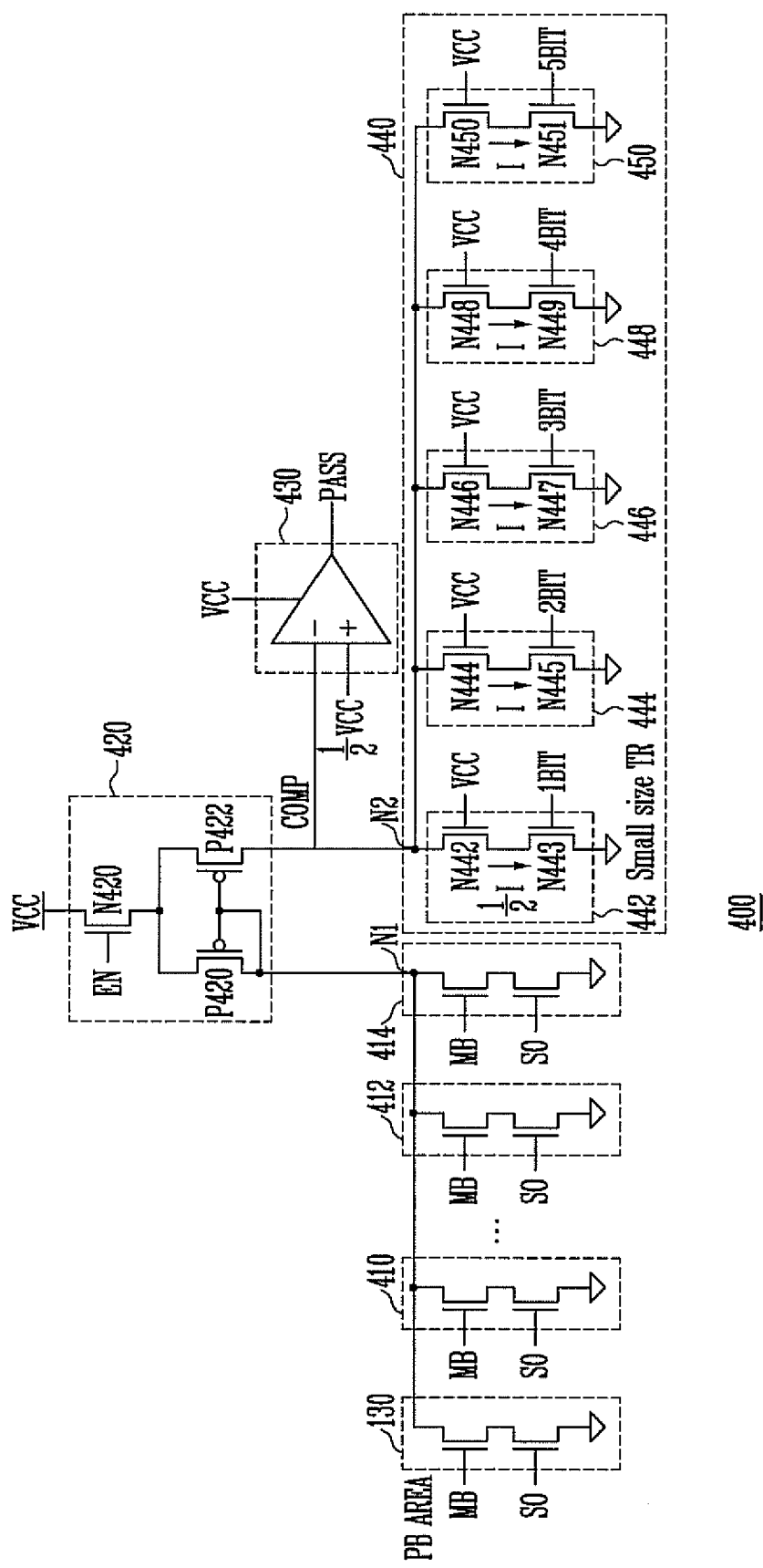

NONVOLATILE MEMORY DEVICE

CROSS-REFERENCE TO RELATED APPLICATION

Priority to Korean patent application number 10-2009-0008802 filed on Feb. 4, 2009, the entire disclosure of which is incorporated by reference herein, is claimed.

BACKGROUND

Embodiments relate to a construction for determining pass bits of a nonvolatile memory device.

In recent years, there has been an increasing demand for nonvolatile memory devices which can be electrically programmed and erased and which do not require the refresh function of rewriting data at specific intervals.

The nonvolatile memory device is configured to enable electrical program and erase operations, and perform the program and erase operations through the threshold voltage of a cell which varies when electrons are moved by applying a strong electric field to a thin oxide layer. During the programming operation of the nonvolatile memory device, a verification operation for determining whether a cell to be programmed has been programmed to exceed a reference voltage is performed.

In performing such a verification operation, a point of time, at which the cell is programmed to exceed the reference voltage, is sought to be checked. Furthermore, there is a need to check a point of time at which the number of cells programmed to exceed a reference voltage reaches a predetermined number.

BRIEF SUMMARY

Some embodiments provide a nonvolatile memory device including a page buffer which is capable of determining a point in time at which cells are programmed to exceed a reference voltage, and a pass bit number determination apparatus.

A page buffer of a nonvolatile memory device according to the present disclosure comprises a first data latch unit configured to store data for program or program inhibition, a second data latch unit configured to store data for setting threshold voltage states of cells to be programmed, and a 1-bit pass determination unit configured to determine whether a cell to be programmed has been programmed to exceed a verification voltage by grounding or making floating a first verification signal output terminal in response to data set to a first node of the first data latch unit and data applied to a sense node.

A nonvolatile memory device according to the present disclosure comprises a plurality of page buffers, a first verification signal output terminal, and a 1-bit pass signal output unit. Each of the page buffers comprises a 1-bit pass determination unit for determining whether a cell to be programmed has been programmed to exceed a verification voltage in response to data applied to a first data latch unit and a sense node. The first verification signal output terminal is coupled in parallel to an output terminal of the 1-bit pass determination unit of each page buffer. The 1-bit pass signal output unit outputs a signal, confirming whether a cell programmed to exceed the verification voltage has been programmed, according to a state of the first verification signal output terminal.

A pass bit number determination apparatus of a nonvolatile memory device according to the present disclosure comprises a reference current setting unit configured to control a number of current paths which are opened according to a number of pass bits, a current mirror unit configured to reflect current via 1-bit pass determination units of respective page buffers toward the reference current setting unit, and a pass signal output unit configured to output a pass signal according to a voltage applied to a connection node of the current mirror unit and the reference current setting unit.

BRIEF DESCRIPTION OF THE DRAWINGS

FIG. 4 is a circuit diagram showing a pass bit number determination apparatus of the nonvolatile memory device according to another embodiment of the present disclosure.

DESCRIPTION OF EMBODIMENTS

Figure 1:
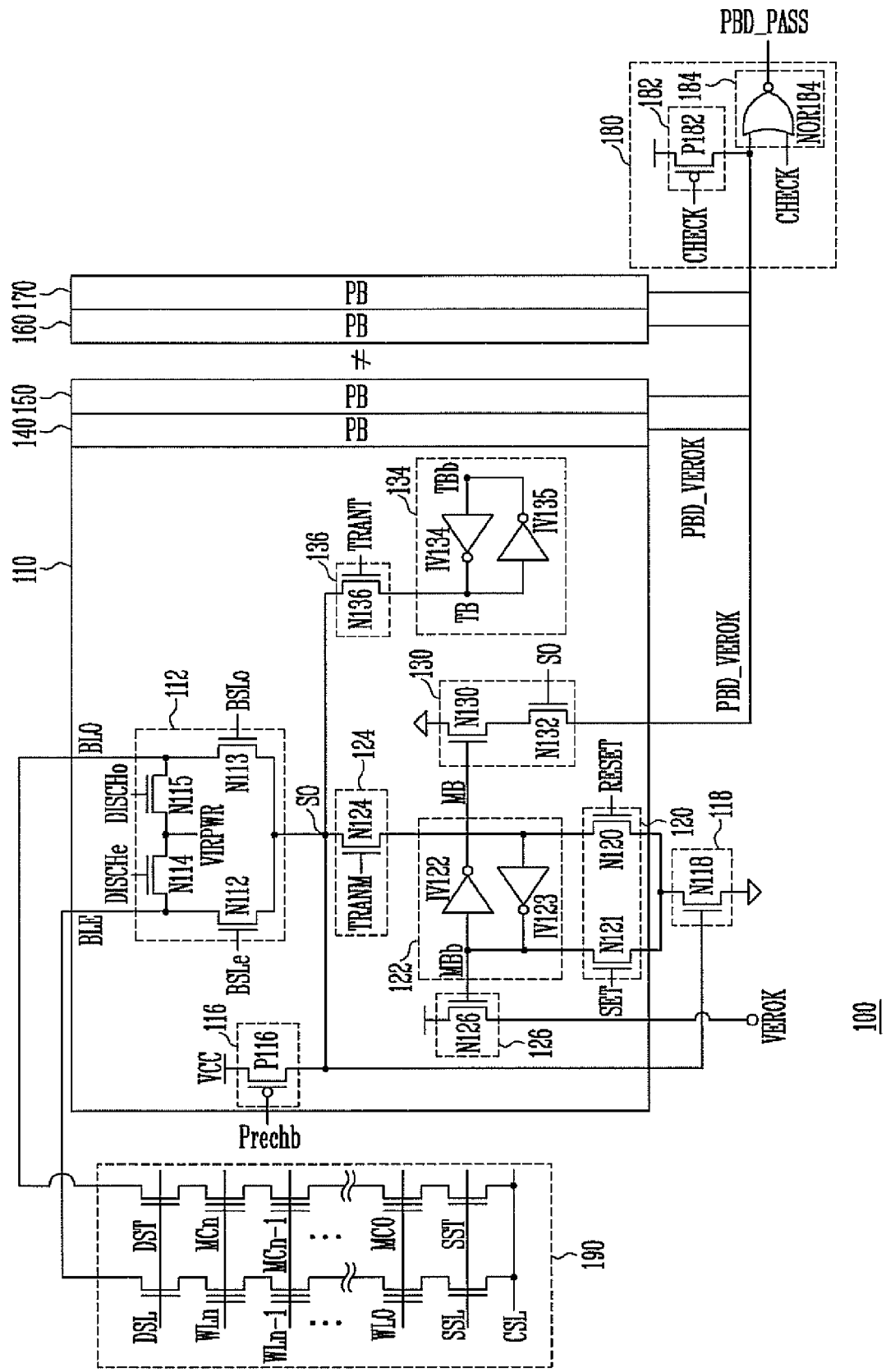
FIG. 1 is a diagram showing a nonvolatile memory device according to an embodiment.

Hereinafter, some embodiments of the present disclosure will be described in detail with reference to the accompanying drawings. The drawing figures are provided to allow those having ordinary skill in the art to understand the scope of the embodiments of the disclosure.

FIG. 1 is a diagram showing a nonvolatile memory device according to an embodiment.

The nonvolatile memory device 100 includes a plurality of page buffers 110, 140, 150, 160, and 170, a 1-bit pass signal output unit 180, and a memory cell array 190.

The memory cell array 190 includes memory cells MC0 to MCn configured to store data, word lines WL<0:n> configured to select and activate the memory cells, and bit lines BLe and BLo configured to input or output data of the memory cells. The plurality of word lines and the plurality of bit lines are arranged in a matrix form.

The memory cell array 190 includes drain selection transistors DST coupled between the bit lines and the memory cells and source selection transistors SST coupled between a common source line CSL and the memory cells. Furthermore, the plurality of memory cells are coupled in series between the source selection transistor SST and the drain selection transistor DST, which is called a cell string.

The gates of the memory cells are coupled to the respective word lines, and a set of the memory cells coupled in common to the same word line is called a page. A plurality of the cell strings coupled to the respective bit lines is coupled in parallel to the common source line, thereby constituting a block.

The page buffers 110, 140, 150, 160, and 170 have the same construction. Thus, only one of the page buffers is described in detail as an example.

The page buffer 110 includes a bit line selection unit 112, a sense node precharge unit 116, first and second data latch units 122 and 134, a data setting unit 120, a sense node sense unit 118, a first data transmission unit 124, a second data transmission unit 136, a pass completion determination unit 126, and a 1-bit pass determination unit 130. The bit line selection unit 112 selectively couples a bit line, coupled to a specific cell, to a sense node SO. The sense node precharge unit 116 applies a power supply voltage of a logic high level to the sense node SO. The first and second data latch units 122 and 134 temporarily store data to be programmed into a specific cell or temporarily store data read from a specific cell.

The data setting unit 120 inputs data to be stored in the first data latch unit 122 thereto. The sense node sense unit 118 applies a ground voltage to a specific node of the first data latch unit 122 according to a level of the sense node SO. The first data transmission unit 124 applies data, stored in the first data latch unit 122, to the sense node SO. The second data transmission unit 136 applies data, stored in the second data latch unit 134, to the sense node SO. The pass completion determination unit 126 determines whether cells to be programmed have been programmed according to data stored in the first data latch unit 122. The 1-bit pass determination unit 130 performs a 1-bit pass according to data stored in the first data latch unit 122 and data applied to the sense node SO. Although not shown, in the case where one cell performs an MLC programming operation configured to store data of two bits or more, a greater number of the data latch units may be included according to the number of bits. In other words, since more data have to be stored in order to distinguish the states of the data, a greater number of the data latch units than are shown in FIG. 1 may be coupled to the nonvolatile memory device. Furthermore, a data setting unit, a data transmission unit, etc. may be further coupled to each additional data latch unit.

The bit line selection unit 112 includes an NMOS transistor N112 configured to couple the even bit line BLe and the sense node SO in response to a first bit line selection signal BSLe, and an NMOS transistor N113 configured to couple the odd bit line no and the sense node SO in response to a second bit line selection signal BSLo.

The bit line selection unit 112 further includes a variable voltage input terminal configured to apply a variable voltage VIRPWR of a specific level, an NMOS transistor N114 configured to couple the even bit line BLe and the variable voltage input terminal in response to a first discharge signal DISCHe, and an NMOS transistor N115 configured to couple the odd bit line BLo and the variable voltage input terminal in response to a second discharge signal DISCHo.

The sense node precharge unit 116 applies a high-level voltage VCC to the sense node SO in response to a precharge signal Prechb. To this end, the sense node precharge unit 116 includes a PMOS transistor P116 coupled between the power supply voltage terminal VCC and the sense node SO. Accordingly, the sense node precharge unit 116 applies the power supply voltage of a logic high level to the sense node SO in response to the precharge signal Prechb of a logic low level.

The first data latch unit 122 temporarily stores data to be programmed into a specific cell or temporarily stores data read from a specific cell. To this end, the first data latch unit 122 includes a first inverter IV122 and a second inverter IV123. The output terminal of the first inverter IV122 is coupled to the input terminal of the second inverter IV123, and the output terminal of the second inverter IV123 is coupled to the input terminal of the first inverter IV122.

Here, a node where the output terminal of the first inverter IV122 is coupled to the input terminal of the second inverter IV123 is called a first node MB, and a node where the output terminal of the second inverter IV123 is coupled to the input terminal of the first inverter IV122 is called a second node MBb.

For example, in the case where data of a high logic level is applied to the first node MB, the data is inverted by the second inverter, and so data of a logic low level is applied to the second node MBb. The inverted data is again inverted by the first inverter. Accordingly, there is a data storage effect in which the data of a logic high level applied to the first node MB remains intact. Likewise, in the case where data of a logic low level is applied to the first node MB, the data is inverted by the second inverter, and so data of a logic high level is applied to the second node MBb. The inverted data is again inverted by the first inverter. Accordingly, there is a data storage effect in which the data of a logic low level applied to the first node MB remains intact.

The data setting unit 120 includes a first data setting transistor N1120 configured to apply a ground voltage to the first node MB of the data latch unit 122 and a second data setting transistor N121 configured to apply a ground voltage to the second node MBb of the data latch unit 122.

The first data setting transistor N120 is coupled between the sense node sense unit 118 and the first node MB and is configured to apply the ground voltage, received from the sense node sense unit 118, to the first node MB in response to a first data setting signal RESET.

Furthermore, the second data setting transistor N121 is coupled between the sense node sense unit 118 and the second node MBb and is configured to apply the ground voltage, received from the sense node sense unit 118, to the second node MBb in response to a second data setting signal SET.

The sense node sense unit 118 applies the ground voltage to the data setting unit 120 according to a voltage level of the sense node SO. To this end, the sense node sense unit 118 includes an NMOS transistor N118 coupled between the data setting unit 120 and a ground terminal.

Accordingly, the sense node sense unit 118 applies the ground voltage to the data setting unit 120 according to a voltage level of the sense node SO. Only when the voltage level of the sense node is a logic high level does the sense node sense unit 118 apply the ground voltage to the data setting unit 120. Here, when the first data setting signal RESET of a logic high level is applied, the ground voltage is applied to the first node MB. In this case, it is recognized that data of a logic low level has been applied to the first node MB. However, when the second data setting signal SET of a logic high level is applied, the ground voltage is applied to the second node MBb. In this case, it is recognized that data of a logic high level has been applied to the first node MB.

The first data transmission unit 124 selectively applies data, stored in the first node MB of the data latch unit 122, to the sense node SO. To this end, the first data transmission unit 124 includes a data transmission transistor N124 configured to selectively couple the first node MB and the sense node MBb in response to a data transmission signal TRANM.

The pass completion determination unit 126 includes a switching element N126 coupled in series between a power supply voltage terminal and a second verification signal output terminal VEROK. Here, the switching element N126 is turned on according to the second node MBb of the data latch unit 122. When data of a logic high level is applied to the second node MBb of the data latch unit 122, a power supply voltage is output to the second verification signal output terminal VEROK. When the power supply voltage is applied to the second verification signal output terminal VEROK, the output is recognized as a fail signal, indicating that verification has not been completed. Typically, in the case of data to be programmed, data '1' is stored in the second node MBb. If programming of the data to be programmed is completed, the data '1' changes to data '0'. That is, if all cells are fully programmed to exceed a reference voltage, the data '0' is stored in the second node MBb. Accordingly, if programming for all the cells is completed, the switching element N126 of each of the pass completion determination units 126 is turned off. Consequently, the second verification signal output terminal VEROK becomes a floating state.

The second data latch unit 134 has the same construction as the first data latch unit 122 and temporarily stores data to be programmed into a specific cell or temporarily stores data read from a specific cell. To this end, the second data latch unit 134 includes a first inverter IV134 and a second inverter IV135. The output terminal of the first inverter IV134 is coupled to the input terminal of the second inverter IV135, and the output terminal of the second inverter IV135 is coupled to the input terminal of the first inverter IV134.

Here, a node where the output terminal of the first inverter IV134 is coupled to the input terminal of the second inverter IV135 is called a first node TB, and a node where the output terminal of the second inverter IV135 is coupled to the input terminal of the first inverter IV134 is called a second node TBb. In the present disclosure, the 1-bit pass determination unit 130 determines a 1-bit pass according to the first node MB and data of the sense node SO. The data of the sense node SO is determined according to data stored in the second data latch unit 134.

The second data transmission unit 136 selectively applies data, stored in the first node TB of the second data latch unit 134, to the sense node SO. To this end, the second data transmission unit 136 includes a data transmission transistor N136 configured to selectively couple the first node TB and the sense node SO in response to a data transmission signal TRANT.

The 1-bit pass determination unit 130 determines whether a cell to be programmed, coupled to the page buffer 110, has been programmed to exceed a reference voltage. To this end, the 1-bit pass determination unit 130 includes first and second switching elements N130 and N132 coupled in series between a ground terminal and a first verification signal output terminal PBD_VEROK. Here, the first switching element N130 is turned on according to the first node MB of the first data latch unit 122, and the second switching element N132 is turned on according to the sense node SO.

Typically, in the case of data to be programmed, data '0' is stored in the first node MB of the first data latch unit 122. When programming of the data to be programmed is completed, the data '0' changes to data '1'. Furthermore, data stored in the sense node SO changes according to a cell to be programmed. This is described in detail with reference to the drawings.

Figure 2:
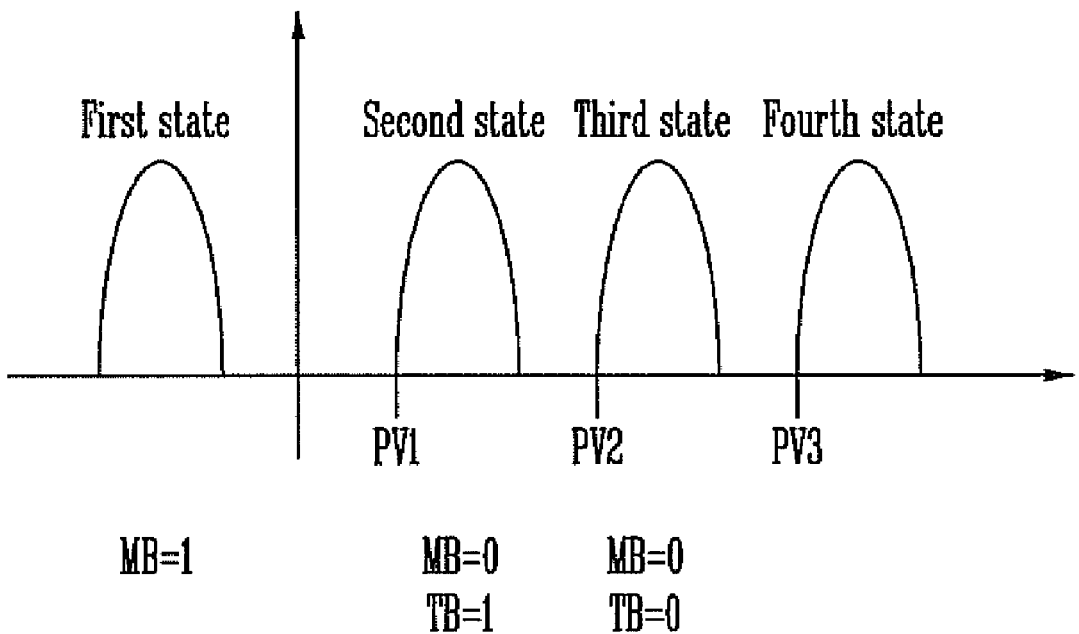
FIG. 2 is a diagram showing the concept of a multi-level cell (MLC) programming method of the nonvolatile memory device according to the present disclosure.

FIG. 2 is a diagram showing the concept of an MLC programming method of the nonvolatile memory device according to the present disclosure.

As shown in FIG. 2, cells are to be programmed so that they have four different threshold voltage distributions. The first state is an erase state, and it maintains a state in which a programming operation is not performed on cells on which an erase operation has been performed. Accordingly, cells in which data '1' is stored in the first node MB of the first data latch unit 122 maintain the first state.

Cells having the second state correspond to cells which will be programmed to exceed a first reference voltage PV1. In these cells, data '0' is stored in the first node MB of the first data latch unit 122, and data '1' is stored in the first node TB of the second data latch unit 134.

Cells having the third state correspond to cells which will be programmed to exceed a second reference voltage PV2. In these cells, data '0' is stored in the first node MB of the first data latch unit 122, and data '0' is stored in the first node TB of the second data latch unit 134.

Although not shown in FIG. 1, in a construction in which a data latch unit is further added to the sense node SO, the fourth state varies according to data stored in the added data latch unit. Furthermore, if the number of states increase, corresponding data latch units may be added to the sense node SO.

In the present disclosure, a point in time, at which cells are programmed to exceed the first reference voltage PV1 occurs, is sought to be determined. Such a function can be performed using only the two data latch units. That is, in the case where data '0' stored in the first node MB changes to data '1' by a programming operation, data '1' stored in the first node TB is transferred to the sense node SO thereby changing the sense node SO to a logic high-level state, which controls the 1-bit pass determination unit 130 such that the ground voltage is transferred to the first verification signal output terminal PBD_VEROK.

Meanwhile, according to this and other embodiments, data of the sense node SO can be set irrespective of data stored in the second data latch unit. That is, if a memory cell is programmed to exceed the first reference voltage PV1, voltage of the sense node SO can be automatically set to a logic high level by a verification operation.

The verification operation is described in detail below. First, a bit line coupled to a cell to be verified is precharged to a logic high level. Next, in the state in which the remaining cells (other than the cell to be verified) are turned on, a reference voltage is applied to the gate of the cell to be verified. In the case where the threshold voltage of each cell exceeds a reference voltage, the voltage level of the bit line maintains a logic high level because the corresponding cell is not turned on. However, if the threshold voltages of cells are lower than the reference voltage, the corresponding cells are turned on. Accordingly, if all cells within a cell string are turned on, a current path through the corresponding cell string is formed, and voltage of the bit line is discharged through the common source line CSL of a ground state. That is, when the threshold voltage of a cell to be verified exceeds a reference voltage, voltage of a bit line maintains a logic high-level state. When the threshold voltage of the cell to be verified is less than the reference voltage, voltage of the bit line is discharged. The voltage level of the bit line is sensed, and a sensing result is applied to the sense node SO. Accordingly, when the threshold voltage of the cell to be verified exceeds the reference voltage, the sense node SO maintains a logic high-level state. When the threshold voltage of the cell to be verified is less than the reference voltage, the sense node SO maintains a logic low-level state.

Accordingly, in the case in which any one cell is programmed to exceed a reference voltage, the sense node sense unit 118 is driven because the voltage level of the sense node SO maintains a logic high level, and so a ground voltage is transferred to the data setting unit 120. Here, since the second data setting signal SET is applied, data '0' stored in the first node MB changes to data '1'. Accordingly, if a cell to be programmed is programmed to exceed a reference voltage, voltage of a logic high level is applied to the sense node SO, and data '1' is applied to the first node MB of the first data latch unit 122. Thus, the ground voltage is output to the first verification signal output terminal PBD_VEROK.

Meanwhile, in the case of cells that will maintain an erase state (i.e., program-inhibited cells), data '1' is stored in the first node MB from an initial operation. On the other hand, in the case of cells to be erased, a voltage level of the sense node SO will maintain a logic low level during a read operation. Accordingly, the 1-bit pass determination unit 130 does not output the ground voltage to the first verification signal output terminal PBD_VEROK.

Further, in the case where the ground voltage is applied to the first verification signal output terminal PBD_VEROK, it is interpreted that one or more cells programmed to exceed a reference voltage exist (i.e., a 1-bit pass has occurred).

If the 1-bit pass determination units 130 are coupled to respective page buffers, whether cells programmed to exceed a reference voltage have been programmed within a single page can be checked. Such an operation is performed by the 1-bit pass signal output unit 180.

The 1-bit pass signal output unit 180 receives the outputs of the 1-bit pass determination units 130 coupled to respective page buffers and outputs a 1-bit pass signal. To this end, the 1-bit pass signal output unit 180 outputs a signal PBD_PASS, checking whether a 1-bit pass has occurred, in response to a signal of the first verification signal output PBD_VEROK and a check signal CHECK.

To this end, the 1-bit pass signal output unit 180 includes a pull-up unit 182 configured to precharge the first verification signal output terminal PBD_VEROK to a logic high level in response to the check signal CHECK, and a 1-bit pass signal generator 184 configured to receive the check signal CHECK and a signal of the first verification signal output terminal PBD_VEROK and to output the 1-bit pass signal PBD_PASS.

The pull-up unit 182 includes a PMOS transistor P182 coupled between the first verification signal output terminal PBD_VEROK and the power supply voltage terminal and configured to have a gate to which the check signal CHECK is input. Accordingly, when the check signal CHECK of a logic low level is applied, the pull-up unit 182 pulls up the first verification signal output terminal PBD_VEROK to a logic high level.

The 1-bit pass signal generator 184 includes a NOR gate NOR184 configured to receive the check signal CHECK and a signal of the first verification signal output terminal PBD_VEROK.

The operation of the 1-bit pass signal output unit 180 is described below. First, when the check signal CHECK of a logic low level is applied, the pull-up unit 182 precharges the first verification signal output terminal PBD_VEROK to a logic high level. Furthermore, a logic low-level signal is applied to the NOR gate NOR184. Accordingly, the 1-bit pass signal PBD_PASS of a logic low level is output.

For a programming operation, data '0' or '1' is stored in the first node MB. Here, the data '0' indicates cells to be programmed, and the data '1' indicates program-inhibited cells. Furthermore, in the case of cells which will be programmed to have the second state of FIG. 2, data '1' is stored in the first node TB of the second data latch unit 134.

Accordingly, the first switching elements N130 are turned off by the cells to be programmed, and so the output terminal of each of the 1-bit pass determination units 130 becomes a floating state. Furthermore, since the sense node of the program-inhibited cells will maintain a logic low-level state, the second switching elements N132 are turned off, and so the output terminal of each of the 1-bit pass determination units 130 becomes a floating state.

That is, the first verification signal output terminal PBD_VEROK maintains a floating state until cells programmed to exceed a verification voltage are programmed by the programming operation.

Next, if cells programmed to exceed the first reference voltage, from among the cells to be programmed, are programmed, data '1' is stored in the first node MB of the first data latch unit 122, and data '1' is stored in the sense node SO. Accordingly, the output terminal of the 1-bit pass determination unit 130 of a corresponding page buffer becomes a ground state. That is, the first switching element N130 and the second switching element N132 are turned on, and so the first verification signal output terminal PBD_VEROK is grounded.

Accordingly, since a precharge level by the pull-up unit P182 is grounded by the first verification signal output terminal PBD_VEROK, a signal of a logic low level is input to one terminal of the NOR gate NOR184. Accordingly, the 1-bit pass signal PBD_PASS of a logic high level, indicating that one or more cells programmed to exceed the reference voltage have been programmed, is output. That is, when the 1-bit pass signal PBD_PASS of a logic high level is output, it means that one or more cells programmed to exceed the reference voltage have been programmed. When the 1-bit pass signal PBD_PASS of a logic low level is output, it means that any cell programmed to exceed the reference voltage has not been programmed. A detailed construction of such a logic combination unit may be changed by a practician.

Figure 3:
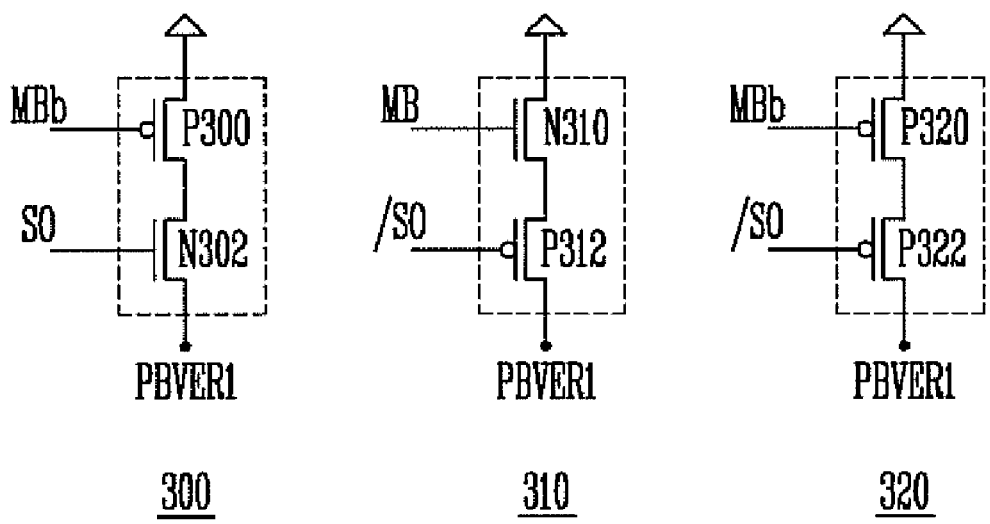
FIG. 3 is a diagram showing modified embodiments of a 1-bit pass determination unit according to the present disclosure.

FIG. 3 is a diagram showing modified embodiments of a 1-bit pass determination unit according to an embodiment.

A 1-bit pass determination unit 300 on the left side of FIG. 3 includes a PMOS transistor P300 and an NMOS transistor N302 coupled in series between the ground terminal and the first verification signal output terminal PBD_VEROK. The PMOS transistor P300 is turned on in response to data of the second node MBb. Accordingly, the 1-bit pass determination unit 300 performs substantially the same operation as the NMOS transistor N130 which is turned on in response to data of the first node MB shown in FIG. 1.

A 1-bit pass determination unit 310 at the center of FIG. 3 includes an NMOS transistor N310 and a PMOS transistor P312 coupled in series between the ground terminal and the first verification signal output terminal PBD_VEROK. The PMOS transistor P312 is turned on in response to an inverted sense node signal /SO. Accordingly, the 1-bit pass determination unit 310 performs substantially the same operation as the NMOS transistor N132 which is turned on in response to data of the sense node SO shown in FIG. 1.

A 1-bit pass determination unit 320 on the right side of FIG. 3 includes a PMOS transistor P320 and a PMOS transistor P322 coupled in series between the ground terminal and the first verification signal output terminal PBD_VEROK. The PMOS transistor P320 is turned on in response to data of the second node MBb. Furthermore, the PMOS transistor P322 is turned on in response to an inverted sense node signal /SO. Accordingly, the 1-bit pass determination unit 320 performs substantially the same operation as the 1-bit pass determination unit 130 shown in FIG. 1.

FIG. 4 is a circuit diagram showing a pass bit number determination apparatus of the nonvolatile memory device according to another embodiment of the present disclosure.

The pass bit number determination apparatus 400 includes a reference current setting unit 440 configured to set the number of current paths according to the number of pass bits to be read, a current mirror unit 420 configured to reflect current, which passes the 1-bit pass determination units of respective page buffers, toward the reference current setting unit 440, and a pass signal output unit 430 configured to output a pass signal according to voltage applied to a node of the current mirror unit 420 and the reference current setting unit 440.

First, each of the 1-bit pass determination units 130, 410, 412, and 414 has the same construction as the 1-bit pass determination unit 130 shown in FIG. 1. The 1-bit pass determination unit included in each of the page buffers is coupled in parallel to a first node N1. Whenever the 1-bit pass determination unit is driven, it discharges a current as much as 'I'.

Thus, when an n number of bits are passed and an n number of the 1-bit pass determination units are driven, a total of current 'n*I' flows through the first node N1.

The current mirror unit 420 includes a driving element N420 configured to supply a power supply voltage VCC to the current mirror unit 420 in response to a driving signal EN, a first PMOS transistor P420 coupled between the driving element N420 and the first node N1, and a second PMOS transistor P422 coupled between the driving element N420 and a second node N2. Here, the first PMOS transistor P420 is diode-coupled and configured to play the role of a static voltage source. Furthermore, the gates of the first PMOS transistor P420 and the second PMOS transistor P422 are interconnected, and so the same current that flows through the first PMOS transistor P420 also flows through the second PMOS transistor P422. That is, the first PMOS transistor P420 and the second PMOS transistor P422 perform a current mirror operation.

The reference current setting unit 440 includes a plurality of current discharge units 442, 444, 446, 448, and 450 coupled between a terminal through which the mirror current of the current mirror unit 420 flows (i.e., the second node N2) and a ground terminal. Each of the current discharge units includes first and second switching elements coupled in series between the second node N2 and the ground terminal. The first switching element is coupled to the power supply voltage (VCC) terminal and is configured to stay turned on. The second switching element is turned on in response to a control signal.

The first current discharge unit 442 includes a first switching element N442 and a second switching element N443 both of which consist of an NMOS transistor. Here, each of the NMOS transistors of the first current discharge unit 442 consists of an NMOS transistor having a different current from an NMOS transistor of other current discharge units. In other words, assuming that current supplied from the current mirror unit 420 is 'I', the first current discharge unit 442 consists of NMOS transistors which are capable of discharging current of '1/2*I'. Preferably, the NMOS transistors of the first current discharge unit 442 have a channel width to length ratio (W/L) that is 1/2 of the other NMOS transistors included in the reference current setting unit 440.

Consequently, in the case where only the first current discharge unit 442 is driven and the current mirror unit 420 supplies a current as much as 'I', only current of 1/2*I is discharged. Thus, the voltage of the second node N2 becomes higher than 1/2 of the power supply voltage (i.e., 1/2*VCC).

The second current discharge unit 444 includes a first switching element N444 and a second switching element N445 both of which consist of an NMOS transistor. The first switching element N444 is always turned on by a power supply voltage VCC, and the second switching element N445 is selectively turned on in response to a 2-bit pass detection signal 2BIT.

The third current discharge unit 446 includes a first switching element N1446 and a second switching element N447 both of which consist of an NMOS transistor. The first switching element N446 always remains turned on by a power supply voltage VCC, and the second switching element N447 is selectively turned on in response to a 3-bit pass detection signal 3BIT.

The fourth current discharge unit 448 includes a first switching element N448 and a second switching element N449 both of which consist of an NMOS transistor. The first switching element N448 is always turned on by a power supply voltage VCC, and the second switching element N449 is selectively turned on in response to a 4-bit pass detection signal 4BIT.

The fifth current discharge unit 450 includes a first switching element N450 and a second switching element N451 both of which consist of an NMOS transistor. The first switching element N450 is always turned on by a power supply voltage VCC, and the second switching element N451 is selectively turned on in response to a 5-bit pass detection signal 5BIT.

Each of the second to fifth current discharge units can discharge all current 'I' supplied from the current mirror unit 420, unlike the first current discharge unit 442.

The pass signal output unit 430 includes a comparison unit configured to compare a reference voltage (1/2VCC) and voltage applied to the second node N2 of the current mirror unit 420 and to output a pass signal PASS. When voltage applied to the second node N2 is smaller than the reference voltage (1/2VCC), the pass signal output unit 430 outputs the pass signal PASS of a logic high level. Meanwhile, when voltage applied to the second node N2 is greater than the reference voltage (1/2VCC), the pass signal output unit 430 outputs the pass signal PASS of a logic low level. In the present disclosure, when voltage applied to the second node N2 is greater than the reference voltage (1/2VCC) (i.e., when the pass signal PASS of a logic low level is output), it is determined to be a pass.

The operation of the apparatus 400 is described in detail below.

First, the number of pass bits to be read is set. When determining whether 1 bit has been passed, a pass detection signal is not applied. That is, a 1-bit pass can be determined using only the first current discharge unit 442. Since a current path is not formed until a 1-bit pass occurs, voltage of the second node N2 becomes close to the ground by the first current discharge unit 442. In this case, since the voltage of the second node N2 is lower than the reference voltage (1/2VCC), the pass signal PASS of a logic high level is output. It means that there is no cell programmed to exceed the reference voltage (i.e., a pass cell).

If a 1-bit pass occurs, one of the plurality of 1-bit pass determination units forms a current path. In this case, a current as much as 'I' flows through the first node N1 and a 1-bit pass determination unit coupled to a pass cell by the static voltage source of the current mirror unit 420. Here, although the current I has to flow through the second node N2 via the current mirror unit 420, the first current discharge unit 442 can make the current as much as '1/2*I', and so the voltage of the second node N2 becomes higher than the reference voltage (1/2VCC). Accordingly, the pass signal PASS of a logic low level is output. This means that a cell programmed to exceed the reference voltage (i.e., a pass cell) has been programmed. In this case, where no pass detection signal has been applied and only the first current discharge unit 442 has been driven, it is determined that a 1-bit pass has occurred.

In the case where a 2-bit pass is to be checked, the second current discharge unit 444 is driven by applying the 2-bit pass detection signal 2BIT. Thus, the reference current setting unit 440 can discharge a total current as much as '3/2*I'. If a 2-bit pass occurs, two of the plurality of 1-bit pass determination units form a current path, and current as much as '2I' flows through the first node N1 and the 1-bit pass determination units coupled to the pass cells by the static voltage source of the current mirror unit 420. Here, although the current 2I has to flow through the second node N2 via the current mirror unit 420, only the current 3/2*I can flow through the second node N2, and so voltage of the second node N2 becomes higher than the reference voltage (1/2VCC). Accordingly, the pass signal PASS of a logic low level is output. This means that a cell programmed to exceed the reference voltage (i.e., a pass cell) exists. It is determined that a 2-bit pass has occurred because the 2-bit pass detection signal is being applied and the first and second current discharge units 442 and 444 are being driven.

In the case where a 3-bit pass is to be checked, the second and third current discharge units 444 and 446 are driven by applying the 2-bit pass detection signal 2BIT and the 3-bit pass detection signal 3BIT. Thus, the reference current setting unit 440 can discharge a total current as much as '5/2*I'. If a 3-bit pass occurs, three of the plurality of 1-bit pass determination units form a current path, and current as much as '3I' flows through the first node N1 and the 1-bit pass determination units coupled to the pass cells by the static voltage source of the current mirror unit 420. Here, although the current 3I has to flow through the second node N2 via the current mirror unit 420, only the current 5/2*I can flow through the second node N2, and so the voltage of the second node N2 becomes higher than the reference voltage (1/2VCC). Accordingly, the pass signal PASS of a logic low level is output. This means that a cell programmed to exceed the reference voltage (i.e., a pass cell) exists. It is determined that a 3-bit pass has occurred because the 2-bit pass detection signal and the 3-bit pass detection signal are being applied and the first to third current discharge units 442, 444, and 446 are being driven.

In a similar way, in the case where a 4-bit pass is to be checked, the first to fourth current discharge units are driven by applying the 2-bit pass detection signal 2BIT, the 3-bit pass detection signal 3BIT, and the 4-bit pass detection signal 4BIT. Furthermore, in the case where a 5-bit pass is to be checked, the first to fifth current discharge units are driven by applying the 2-bit pass detection signal 2BIT, the 3-bit pass detection signal 3BIT, the 4-bit pass detection signal 4BIT, and the 5-bit pass detection signal 5BIT.

In summary, in the case where an n-bit pass is to be detected, one current discharge unit for discharging current '1/2*I' and an n−1 number of the current discharge units for discharging current 'I' are used. Furthermore, in the case where a 1-bit pass is to be detected, whether the 1-bit pass occurs is checked by driving only one current discharge unit for discharging current '1/2*I'. In the case where an n-bit pass is to be detected, an n number of the current discharge units are driven so that a current as much as $\{(n-1)+1/2\}*I$ is discharged. If the n bit pass occurs, current as much as 'n*I' flows through the first node. Although the current 'n*I' has to flow through the second node, only the current $\{(n-1)+1/2\}*I$ is discharged through the current discharge unit(s). Accordingly, the pass signal of a logic low level (i.e., a signal informing that an n number of bits are a pass) is output.

According to this disclosure, a point in time at which a cell is programmed to exceed a reference voltage can be checked. Accordingly, the present disclosure can find a variety of applications because, when performing a programming operation and a verification operation, a verification operation based on the point of time can be changed.

What is claimed is:

1. A page buffer of a nonvolatile memory device, comprising:
a first data latch unit configured to store data for program or program inhibition;
a second data latch unit configured to store data for setting threshold voltage states of cells to be programmed; and
a 1-bit pass determination unit configured to ground a first verification signal output terminal or make floating the first verification signal output terminal so as to determine whether a cell to be programmed has been programmed to exceed a verification voltage in response to data set to a first node of the first data latch unit and data applied to a sense node.

2. The page buffer of claim 1, wherein the 1-bit pass determination unit comprises first and second switching elements coupled in series between a ground terminal and the first verification signal output terminal, the first switching element being turned on in response to the data set to the first node of the first data latch unit, and the second switching element being turned on in response to the data applied to the sense node.

3. The page buffer of claim 1, wherein data of a logic low level, which is data to be programmed, or data of a logic high level, which is data to be erased, are stored in the first node of the first data latch unit.

4. The page buffer of claim 1, wherein the cells to be programmed comprise cells, which will be programmed to have a threshold voltage lower than a second reference voltage but higher than a first reference voltage, where data of a logic low level is stored in the first node of the first data latch unit, and data of a logic high level is stored in a first node of the second data latch unit.

5. The page buffer of claim 4, wherein the sense node has a logic high-level state according to the data stored in the first node of the second data latch unit.

6. The page buffer of claim 1, wherein the data set to the first node of the first data latch unit is changed from data indicative of data to be programmed to data indicative of data to be erased, if a cell to be programmed is programmed to exceed the verification voltage.

7. The page buffer of claim 1, wherein the 1-bit pass determination unit makes grounded a second verification signal output terminal, if a cell to be programmed is programmed to exceed the verification voltage.

8. The page buffer of claim 2, wherein the first and second switching elements of the 1-bit pass determination unit are turned on, and the first verification signal output terminal is grounded, if a cell to be programmed is programmed to exceed the verification voltage.

9. A nonvolatile memory device, comprising:
a plurality of page buffers, each configured to comprise a 1-bit pass determination unit for determining whether a cell to be programmed has been programmed to exceed a verification voltage in response to data set to a first node of a first data latch unit and data applied to a sense node;
a first verification signal output terminal coupled in parallel to an output terminal of the 1-bit pass determination unit of each page buffer; and
a 1-bit pass signal output unit configured to output a signal, confirming whether a cell programmed to exceed the verification voltage has been programmed, according to a state of the first verification signal output terminal.

10. The nonvolatile memory device of claim 9, wherein each of the 1-bit pass determination units comprises first and second NMOS transistors coupled in series between a ground terminal and the first verification signal output terminal, the first NMOS transistor being turned on in response to data set to the first data latch unit, and the second NMOS transistor being turned on in response to data set to the sense node.

11. The nonvolatile memory device of claim 9, wherein the 1-bit pass signal output unit comprises: a NOR gate configured to receive a signal of the first verification signal output terminal and a check signal, and to output a 1-bit pass signal; and a pull-up unit configured to pull up the first verification signal output terminal in response to the check signal.

12. The nonvolatile memory device of claim 11, wherein the pull-up unit comprises a PMOS transistor coupled between a power supply voltage terminal and the first verification signal output terminal and configured to have a gate for receiving the check signal.

13. The nonvolatile memory device of claim 12, wherein in a state in which the first verification signal output terminal is precharged to a logic high level in response to the check signal of a logic low level, the first verification signal output terminal is grounded by the 1-bit pass determination unit of a page buffer coupled to a cell which has been programmed to exceed the verification voltage.

14. The nonvolatile memory device of claim 12, wherein the 1-bit pass signal output unit outputs the 1-bit pass signal of a logic high level when a cell programmed to exceed the verification voltage has been programmed.

15. A pass bit number determination apparatus of a nonvolatile memory device, comprising:
- a reference current setting unit configured to control a number of current paths which are opened according to a number of pass bits;
- a current mirror unit configured to reflect current via 1-bit pass determination units of respective page buffers toward the reference current setting unit; and
- a pass signal output unit configured to output a pass signal according to a voltage applied to a connection node of the current mirror unit and the reference current setting unit.

16. The pass bit number determination apparatus of claim 15, wherein:
- the reference current setting unit comprises a plurality of current discharge units coupled in parallel to the current mirror unit;
- each of the current discharge units comprises first and second switching elements coupled in series between the current mirror unit and a ground terminal; and
- the first switching element is coupled to a power supply voltage terminal and configured to maintain a turn-on state, and a second switching element is turned on in response to a pass detection signal.

17. The pass bit number determination apparatus of claim 15, wherein the reference current setting unit comprises:
- a first current discharge unit coupled in parallel to the current mirror unit and configured to discharge a current as much as 1/2*I; and
- an (n−1) number of current discharge units, where n is a natural number, coupled in parallel to the current mirror unit and each configured to discharge a current as much as I;
- wherein each of the current discharge units comprises first and second switching elements coupled in series between the current mirror unit and a ground terminal;
- the first and second switching elements of the first current discharge unit are coupled to a power supply voltage terminal and configured to maintain a turn-on state; and
- the first switching element of each of the (n−1) number of current discharge units is coupled to the power supply voltage terminal and configured to maintain a turn-on state, and the second switching element of each of the (n−1) number of current discharge units is turned on in response to a pass detection signal.

18. The pass bit number determination apparatus of claim 17, wherein in the case where an n-bit pass is to be detected, the first current discharge unit and the (n−1) number of current discharge units are driven such that a current as much as $\{(n-1)+1/2\}*I$ is discharged.

19. The pass bit number determination apparatus of claim 17, wherein in the case where an n-bit pass is to be detected, the second switching element of each of the (n−1) number of current discharge units is turned on by applying a pass detection signal to the (n−1) number of current discharge units.

20. The pass bit number determination apparatus of claim 15, wherein the current mirror unit comprises:
- a driving element configured to supply a power supply voltage in response to a driving signal;
- a first PMOS transistor coupled between the driving element and a first node of the current mirror unit and the 1-bit pass determination units; and
- a second PMOS transistor coupled between the driving element and a second node of the current mirror unit and the reference current setting unit, wherein the first PMOS transistor is diode-coupled, and gates of the first PMOS transistor and the second PMOS transistor are coupled to each other.

21. The pass bit number determination apparatus of claim 15, wherein the pass signal output unit comprises a comparison unit configured to output a pass signal by comparing an amount of a reference voltage and a voltage applied to a connection node of the current mirror unit and the reference current setting unit.

* * * * *